United States Patent [19]
Fisch

[11] Patent Number: 5,644,545
[45] Date of Patent: Jul. 1, 1997

[54] BIMODAL REFRESH CIRCUIT AND METHOD FOR USING SAME TO REDUCE STANDBY CURRENT AND ENHANCE YIELDS OF DYNAMIC MEMORY PRODUCTS

[75] Inventor: David E. Fisch, Colorado Springs, Colo.

[73] Assignees: United Memories, Inc., Colorado Springs, Colo.; Nippon Steel Semiconductor Corporation, Chiba, Japan

[21] Appl. No.: 601,179

[22] Filed: Feb. 14, 1996

[51] Int. Cl.⁶ .................................................. G11C 7/00
[52] U.S. Cl. ...................... 365/222; 365/236; 365/230.02
[58] Field of Search ............................ 365/222, 200, 365/236, 230.02

[56] References Cited

U.S. PATENT DOCUMENTS

| | | |
|---|---|---|
| 5,283,885 | 2/1994 | Hollerbauer ........................ 365/222 |
| 5,329,490 | 7/1994 | Murotani ............................ 365/222 |
| 5,469,559 | 11/1995 | Parks et al. ........................ 365/222 |

*Primary Examiner*—David C. Nelms
*Assistant Examiner*—Huan Hoang
*Attorney, Agent, or Firm*—William J. Kubida; Richard A. Bachand; Holland & Hart LLP

[57] ABSTRACT

A method and apparatus for compensating for weak elements of a dynamic memory circuit on an integrated circuit chip is disclosed. The method includes identifying weak elements in the memory circuit. The elements may be identified by a known test program, and may be bits, blocks, or other portion of a dynamic memory circuit. The locations of the identified weak elements are programmed into a programmable memory, and the programmed information in the programmable memory is used to refresh the identified weak elements at a different rate from the refresh rate of other bits. This allows an extended or longer refresh interval to be used for the strong elements, while providing adequate refresh for the weak elements, thereby reducing the refresh interval required for the overall memory circuit from the refresh interval which normally would have been used.

17 Claims, 2 Drawing Sheets

BIMODAL REFRESH CIRCUIT AND METHOD FOR USING SAME TO REDUCE STANDBY CURRENT AND ENHANCE YIELDS OF DYNAMIC MEMORY PRODUCTS

BACKGROUND OF THE INVENTION

1. Field of the Invention

This invention relates to improvements in products containing dynamic bits which must be refreshed to maintain data integrity, and more particularly to improvements in refresh circuits and method for using same to reduce standby current and enhance yields of dynamic memory products.

2. Relevant Background

Dynamic memories are constructed to require periodic refreshing of the data contained in the individual cells of the dynamic memory array. The manner by which dynamic memory cells are refreshed is well known in the art. Typically, retention time of a dynamic RAM has a bimodal distribution. The weak bits typically limit the refresh time and dictate the total refresh frequency and associated refresh current. (Variations in the refresh time which may be required to maintain the contents of a memory cell may arise, for example, due to variations in the manufacturing process in which the cells are constructed, resulting, for instance, in "leaky" memory capacitors, weaknesses in the memory transistor, and so forth.) When these weak bits are addressed independently from the majority of the bits, then the bulk majority of the word lines on a chip can be refreshed at a slower rate. This reduces standby currents by a factor between two to sixteen times, or more. This could have a significant beneficial yield effect on parts with aggressive standby current specifications.

Thus, generally, a refresh cycle for a dynamic memory array is based upon the refresh time required for the weakest cells in the array. That is, if a cell in the array requires a higher refresh frequency than that of the remaining cells in the array, this higher refresh frequency is generally applied to the entire array, and the array refresh specifications are declared to be the shorter refresh time.

Using the shortest time, or weakest bit, to define the refresh time of the array has two salient problems. First, the average speed of the array is decreased, since the memory function of the array cannot be accessed during its refresh. Secondly, the power consumption of the array increases, since the shorter the refresh period, the higher the power that is required to sustain it. The increased power requirements can be an especially important factor in many computer systems in which the dynamic memory components may be used, especially in so-called "laptop" or "notebook" computers, which rely upon batteries to supply their operating power, particularly in a standby mode of operation.

Most prior art solutions involve replacing array rows and columns containing weak bits with redundant rows and columns. The limited number of redundant rows and columns limits the extent to which this can be done to "repair" bad and weak bits. Furthermore, memory arrays are typically divided into subarrays. Often the refresh characteristics of a subarray may be degraded due to local defects affecting this subarray. These degraded subarrays cannot be replaced with standard redundant elements.

Other deficiencies in the prior art are discussed by H. Yamauchi et al., "A Circuit Technology for a Self Refresh 16Mb DRAM with Less than 0.5 µA/mB Data Retention Current," *IEEE Journal of Solid-State Circuits*, Vol. 30, No. 11, November 1995. Yamauchi et al. make reference to the problem of weak bits limiting refresh time. The solution offered by Yamauchi et al. involves changing the cell plate voltages and reference voltages to minimize leakage and allow even bad bits to improve their refresh interval requirements. Yamauchi et al. do not appear to allow for the identification of weak bits or blocks in order to prevent them from limiting the overall chip refresh performance.

SUMMARY OF THE INVENTION

In light of the above, therefore, it is an object of the invention to provide an improved method for refreshing a dynamic memory array, and an improved dynamic memory array using the method.

It is another object of the invention to provide a method of the type described for refreshing a dynamic memory array in which weak cells or blocks or cells are refreshed at a different rate from stronger cells in the array.

These and other objects, features, and advantages of the invention will become apparent to those skilled in the art from the following detailed description, when taken in conjunction with the accompanying drawings and appended claims.

According to a broad aspect of the invention, a method is presented for compensating weak elements of a dynamic memory circuit on an integrated circuit chip. The method includes programming locations of the weak memory elements into a memory and using the programmed locations in the memory to refresh the identified weak elements at a different rate than other elements of the dynamic memory. This allows an extended and longer refresh interval for the strong elements while providing adequate refresh for the weak elements.

According to another broad aspect of the invention, an integrated memory circuit is presented. The circuit has an array of memory elements that require periodic refreshing. The integrated circuit is programmed for a reduced refresh rate based on the refresh characteristics of the normal elements. A table is provided which contains information identifying weak memory elements or subarray blocks containing weak elements. The table may, for example, contain the addresses of the weak memory elements or the addresses of the subarray blocks containing the weak elements. The table may be a programmable table, such as that provided by a nonvolatile memory or a suitable look-up table. Circuitry is connected to refresh the memory elements at a rate which is varied in dependence upon the information identifying weak memory elements in the table. The circuit to refresh the weak elements may be configured to refresh the weak memory elements at a rate higher than the overall reduced refresh rate for the entire integrated circuit. The refresh rate for the weak elements may be, for example, at a rate at least twice that of a normal refresh rate.

BRIEF DESCRIPTION OF THE DRAWINGS

The invention is illustrated in the accompanying drawings, in which.

In the various figures of the drawings, like reference numerals are used to denote like or similar parts.

DETAILED DESCRIPTION OF THE PREFERRED EMBODIMENTS

In accordance with a preferred embodiment of the invention, a method is presented by which the refresh of identified weak bits or blocks of a dynamic memory circuit are compensated. The method by which the invention is accomplished is by identifying weak bits or blocks, for example, through test programs, non-volatily programming the weak address or block locations to an on chip circuit, such as a look-up table or a discrete circuit element, and using this programmed information to refresh the weak bits or blocks at a different rate than the stronger bits.

This method requires relatively simple circuit additions to standard DRAM or other dynamic memory circuits, and can complement standard redundancy techniques. It also offers the flexibility of "repairing" clustered bits or entire array blocks, which require refresh rates exceeding that at which the ratings or specifications of the overall circuit would otherwise allow. This can be a significant yield enhancer and facilitate the development of products having an extremely low sleep mode, self-refresh, or CBR refresh current.

The value of this technique can be appreciated from the observation stated above that typically the retention time of a dynamicRAM is a bimodal distribution. The weak bits typically limit the refresh time and dictate the total refresh current. If these weak bits are addressed independently from the majority of the bits, then the bulk majority of the memory addresses on a chip can be refreshed at a slower rate, thereby reducing standby currents by a factor between two to sixteen times, or more. This could have a significant beneficial yield effect, especially for parts with aggressive standby current specifications.

There are many ways to implement a "bimodal" refresh counter. A simple implementation, for example, is to take a lower order bit ("a toggle bit") from a main refresh counter and use it to halt the main counter and trigger a supplemental refresh address source, such as a second refresh address counter or a "look-up" table of programmable refresh addresses. These supplemental addresses are then refreshed and upon completion the main refresh counter is restarted.

Use of a look-up table allows a fuse or programmable selection of random addresses. On the other hand, a second counter allows identifying blocks of rows using a programmable reduced address input. This would allow, for example, a weak portion of an array to be refreshed at a different rate than the other array portions. For further flexibility, the toggle bit from the main refresh counter could be programmable, thus allowing the "bad blocks" to be refreshed at many different rates, (e.g., 2×, 4×, 8×, etc. of the nominal rate).

Figure 1:
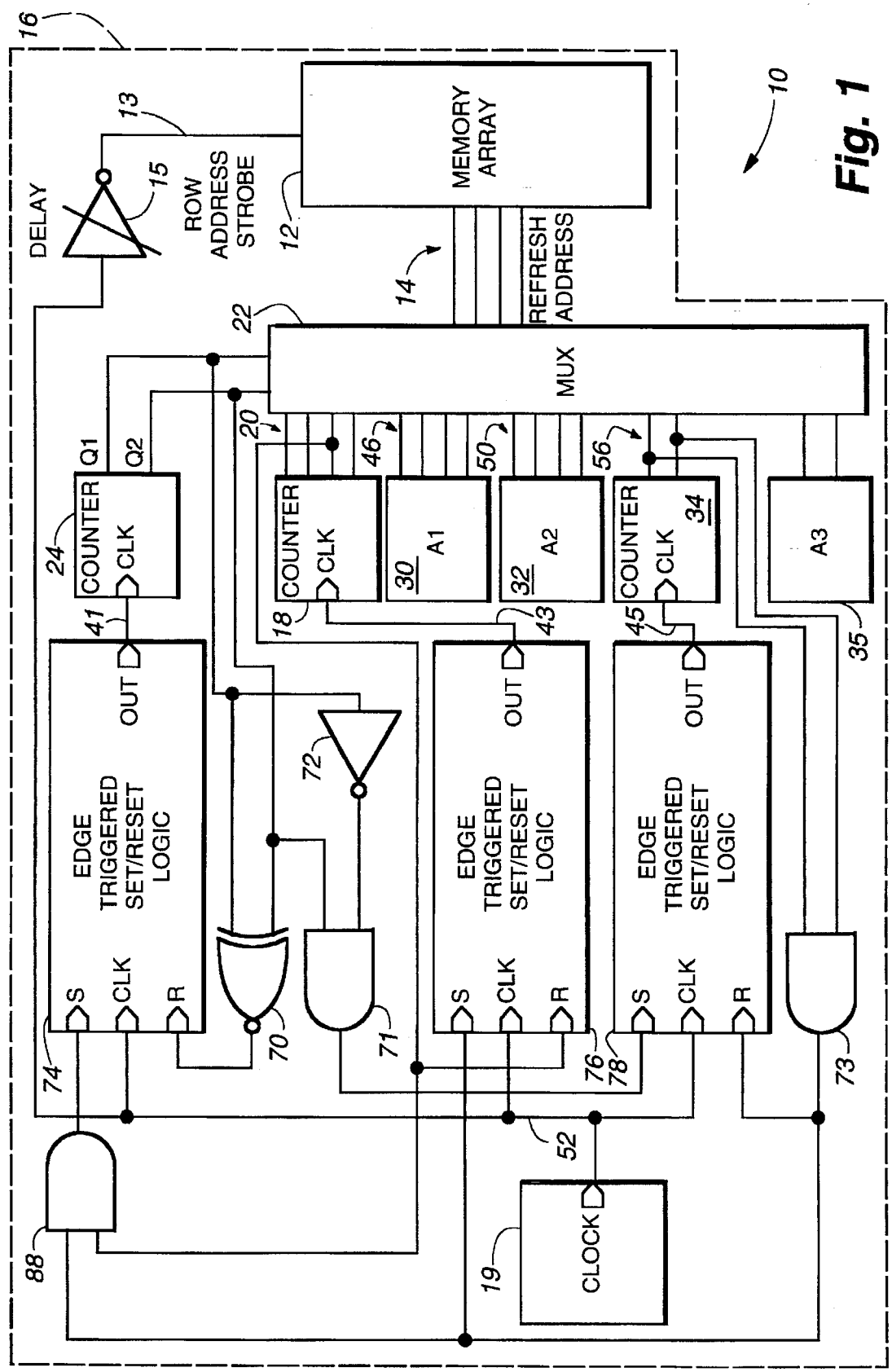
FIG. 1 is a block diagram of one embodiment of a memory refresh circuit for refreshing a plurality of lines and an identified block more rapidly than normal, in accordance with a preferred embodiment of the invention.

A block diagram of one embodiment by which the invention may be accomplished is shown in FIG. 1, to which reference is now made. As shown, a circuit 10 is provided that furnishes refresh addresses to a dynamic memory array 12. The memory array 12 may be of standard construction and may contain an array of memory cells arranged in rows and columns within respective array blocks. The rows and columns of a memory array are sometimes referred to as the word and bit lines, respectively, and, typically, a refresh cycle is normally accomplished by sequentially addressing each of the word lines of the array.

Thus, the memory array 12 has inputs 14 to which refresh addresses are applied, again in known manner. The refresh address furnishing circuit 10 may preferably be integrated onto a semiconductor wafer or chip 16 together with the memory array 12 and other necessary operating components (not shown) well known in the art. The memory array 12 may include a number of dynamic memory cells or other memory elements that require periodic refreshing, and may, together with the remaining components, be a part of a dynamic random access memory (DRAM) product or other product that incorporates such dynamic memory cells as a part thereof.

The refresh address furnishing circuit 10 includes a clock generator 19, which is used to clock the counters of the address circuit 10, as well as to provide a row address strobe signal on line 13 to latch refresh addresses applied to the address inputs 14 of the memory array 12. The strobe signal generated on the line 13 may be a series of short negative polarity pulses that are delayed by a delay circuit 15 from the clock signal on line 52 from the clock generator 19, in order to latch the row addresses into the memory array 12 as a part of a refresh cycle.

The refresh addresses at the inputs 14 of the memory array 12 are derived from the output of a one-of-four multiplexer 22, the input selection of which is controlled by a two bit counter 24. In the embodiment illustrated, the multiplexer 22 provides as an output a selected one of the four refresh address sources that are applied to its four groups of respective input lines 20, 46, 50, and 56. The address inputs, below discussed in detail, are generated respectively by a main refresh address counter 18, supplemental programmable individual refresh address generators 30 and 32, and a supplemental refresh address counter 34 with an associated programmable block identifying address generator 35.

Figure 2:
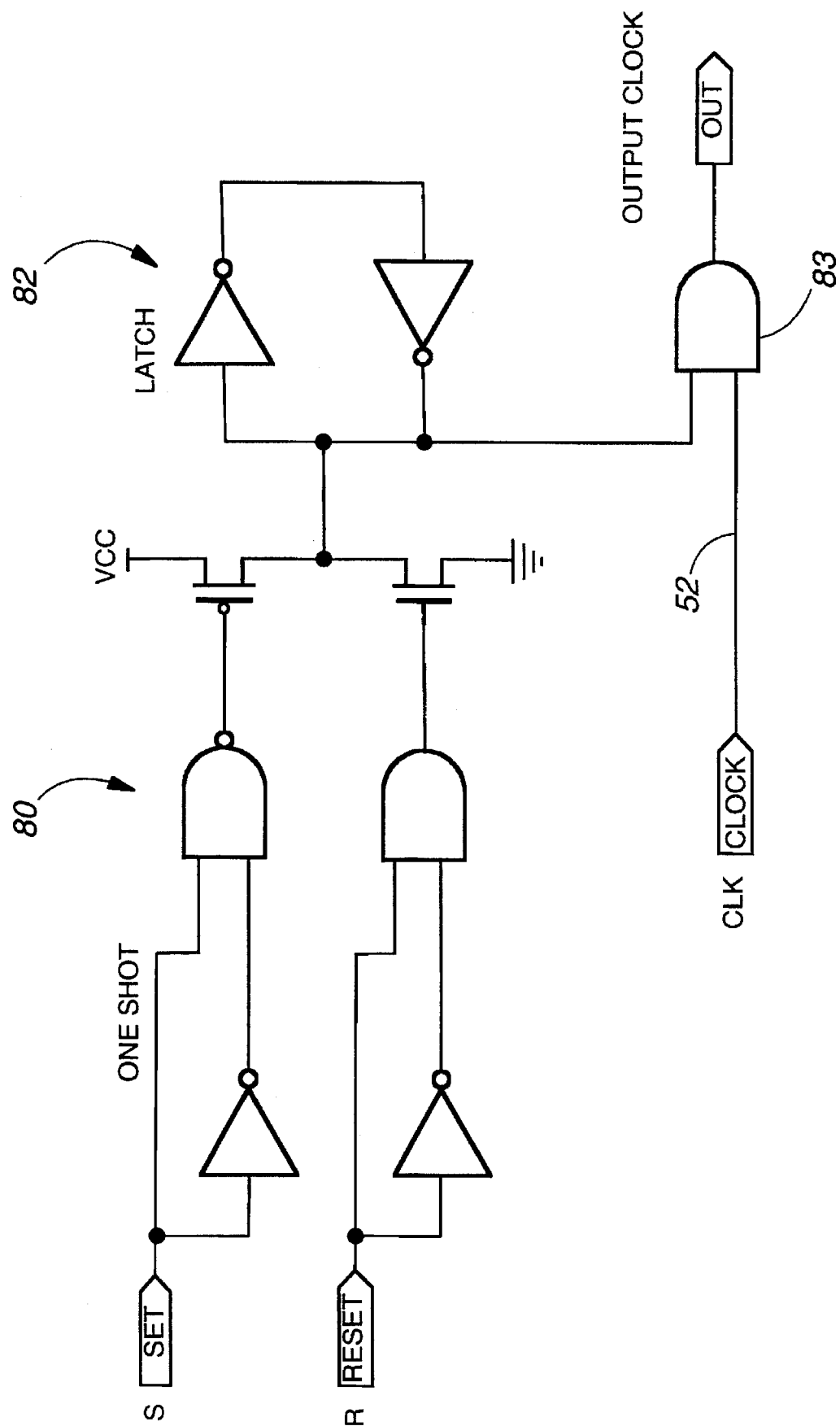
FIG. 2 is an electrical schematic diagram of a logic circuit for controlling the various counters shown in FIG. 1.

Although only four address lines are shown, it should be noted that the number of lines connected between the counter 18, programmable address generators 30 and 32, and counter 34 to the multiplexer 22 will depend upon the particular size of the memory array 12, and may be, for example, eight in number for a memory array which has 256 rows. The number of refresh address lines is a matter of design choice depending upon the size of the memory array to be refreshed. Similarly, although only four address generators are shown, any number of supplemental refresh address sources may be provided as necessary. The counters 24, 18, and 34 each are clocked by the outputs of logic circuits 74, 76, and 78, respectively, details of which being described in FIG. 2, to which reference is now made. The logic circuits 74, 76, and 78 are each similarly constructed, and include a "set" and "reset" one-shot pulse generator 80, the output of which is latched by a latch circuit 82. The output from the latch 82 is applied to an AND gate 83 to enable or disable the clock pulses on line 52 from the clock generator 19 to pass to the respectively associated counter.

Thus, each of the logic circuits 74, 76, and 78 are edge enabled and edge disabled to provide clock signals to its respective associated counter when the output on line 52 of clock generator 19 pulses is high, if the logic circuit has been previously set or enabled by a high going signal at its "set" input. Conversely, the logic circuits 74, 76, and 78 do not provide a high going output signal if they have been previously reset or disabled by a high going signal at their "reset" inputs. Thus the logic circuits 74, 76, and 78 determine whether their respective associated counters are incremented by the clock pulses on line 52 from the clock generator 19.

In operation, in the initial starting condition, logic block 74 is reset, whereby the logic block 74 does not pass the clock pulses on line 52, and counter 24 has outputs Q1 and Q2 which are low. The low states on the Q1 and Q2 outputs of the counter 24 causes the multiplexer 22 to select the set of input lines 20 from the main address counter 18. In addition, initially, the logic block 76 is set and the logic block 78 is reset. The counter 18 has outputs of all one (1111), and counter 34 has outputs of all one (11), as well.

Thus, on each high going clock pulse on the line 52 from the clock generator 19, the logic block 76 provides a clock signal 43 to the clock input of the counter 18 on line 43. Therefore, the counter 18 increments with each successive clock signal and, with each increment, provides a new set of refresh addresses on lines 20 to the multiplexer 22. Since the lines 20 are initially selected by the multiplexer 22, the refresh addresses on lines 20 are passed to the inputs 14 of the memory array 12, and are sequentially latched into the memory array 12 by the strobe signal 13.

It should be noted that the outputs Q1 and Q2 of the counter 24 are connected to the inputs of an exclusive NOR gate 70, which serves to reset the logic circuit 74 when the outputs from the counter 24 is either "OO" or "11", corresponding to the selection of either the counter 18 or the counter 34. Thus, when the counter 18 is in operation, the logic circuit 74 disables the clock pulses on line 52 from passing to clock the counter 24 to allow the counter 18 to continue to be selected.

In the embodiment illustrated, the third address line of the address lines 20 is connected to the reset input of the logic block 76, as well as to one input of an AND gate 88 connected to set the logic block 74, so that when the third address line in address lines 20 goes high it resets the logic block 76, thus disabling it and preventing it from providing a clock output on the next clock pulse on line 52 from clock generator 19. It also sets logic block 74 allowing it to provide a clock output on the next clock pulse on line 52 from the clock generator 19. It should be noted that although the third address line of the address lines 20 is selected above, any of the address lines may be used, which will affect the ratio of the refresh rates of the weaker to the stronger memory cells or blocks, as will become apparent below.

Therefore, upon each occurrence of a positive state change on the third line of the address lines 20, the logic circuit 74 is enabled to pass clock pulses on line 52 from the clock generator 19, and on the next occurring clock pulse on line 52, the counter 24 is incremented, with its output Q1 going high, and with Q2 remaining low. The multiplexer 22 is thereby caused to select address lines 46 from the programmable address generator 30. The programmable address generator 30 provides address values have been non-volatily programmed through fuses or other non-volatile programming elements to identify a specific address that is desired to be refreshed at an increased rate. The address on lines 46 is passed to the refresh address input 14 to be latched into the memory array 12 by the strobe signal 13, thus providing a specific new row address location for refreshing.

When the next clock pulse on line 52 from the clock generator 19 occurs, the counter 24 is again incremented, with Q1 going low and Q2 going high. This selects the address lines 50 from the programmable address generator 32, which in turn is passed by the multiplexer 22 to refresh the address input 14 of the memory array 12. As in the previous cycle, this new address field is latched by the strobe signal 13, to provide the specific new row address to be refreshed.

Although only two programmable address generators 30 and 32 are shown in the embodiment illustrated, it should be understood that any number of such individual address generators may be provided, as desired. Also, the individual address generators are described as a programmable memory device, any device capable of being programmably configured to hold a address may be used.

In addition, Q1 going low and Q2 going high generates a double high on the inputs of the AND gate 71, Q1 being inverted by the inverter 72. Thus, when Q1 is low and Q2 is high, the output of the AND gate 71 is driven high to set the logic block 78. This sets the logic block 78, allowing it to provide clock pulses on line 45 to the counter 34 on the next clock cycle. Thus, on the next clock pulse from clock 19, Q1 and Q2 both go high, selecting input lines 56 for application to the refresh address inputs 14 of the memory array 12. In addition, because the logic block 78 was enabled by the previous clock pulse from the clock 19, the counter 34 increments to "00", providing this address along with the output from the programmable block identification memory 35 to the memory array 12 via address input lines 14.

As mentioned, the outputs Q1 and Q2 of the counter 24 connected to the inputs of the exclusive NOR gate 70 serve to reset the logic circuit 74 when the outputs from the counter 24 is either "00" or "11", corresponding to the selection of either the counter 18 or the counter 34. Thus, when the counter 34 is selected, the logic circuit 74 disables the clock pulses on line 52 from passing to clock the counter 24.

The two output lines from the counter 34 provide signals to two of the address lines 56 to the multiplexer 22, with the address being completed by two address lines provided by programmable memory or address generator 35. The portion of the address supplied by the programmable address generator 35 provides the "block select" lines which identify the subarray within the memory array 12 to which counter the counter 34 will supply row refresh addresses. Thus, in the described embodiment, clock pulse on line 52 from the clock generator 19 cause the memory array 12 to receive sequential refresh addresses from the supplemental counter 34 to refresh all of the rows in the block of the memory array 12 identified by the address programmed into the memory 35.

During the operation of the counter 34, the logic block 74 remains disabled, and the logic block 78 remains enabled. Thus, during this time, the outputs of the counter 24 are still "11". Then, when the outputs of the counter 34 reach a state of "11", the AND gate 73, connected to detect the states on the output lines from the counter 34, produces an output of "1" to disable the logic block 78 and enable the logic block 74 via AND gate 88, whose other input is still high. This blocks subsequent clock pulses on the line 52 from the clock generator 19 into the counter 34 and enables the logic circuit 74. Nevertheless, the final address from the counter 34 is presented to the memory array 12 as the multiplexer 22 is still pointing to counter 34.

Thus, on the next clock pulse on line 52 the counter 24 is incremented, by which Q1 and Q2 change to "00", causing the multiplexer 22 to again select address lines 20. The signals on the address lines 20 from the counter 18 are incremented from their last count, and the multiplexer 22 provides these new addresses for strobing into the memory array 12. In addition when the Q1 and Q2 outputs of the counter 24 go to a "00" state, the exclusive NOR gate 70 provides a high going signal to reset the logic circuit 74. This prevents the counter 24 from incrementing on subsequent clock pulses 52 from clock 19, in the manner described above. At this point refresh addresses will again be provided by the main counter 18 until the signal on the third address line of the address lines 20 once again toggles high. The process then repeats with addresses being provided in turn by address generators 30 and 32 and the counter 34 with its block identification address generator 35.

It can therefore be seen that through the operation of the circuit described above, those memory addresses identified by the programmable memory devices 30, 32, and 35 are refreshed at a rate faster than those of the memory addresses merely counted by the main refresh counter 18. As a consequence, since the refresh rate of the majority of the rows of the memory array 12 can be significantly reduced, the current required to maintain the memory array 12 in, for example, a sleep mode or in a self-refresh mode, can be significantly reduced, as well. This sleep mode current reduction is of great benefit, for example, in notebook computer applications in which the sleep mode current is desirably minimized to prolong the battery life of the computer. Other examples also exist in which the reduction of sleep mode current required by the memory array is desirably reduced. It can be seen, for example, that if a refresh mode were enabled in which the refresh rate of the normal memory cells were reduced by a factor of 5 to 10 times, then the normal refresh current (typically of about 100 microamps currently) can be reduced to refresh currents 5 to 10 times less, or in the neighborhood of 10 to 20 microamps.

It will be also appreciated that through the use of circuitry of the type described above, dynamic memory circuit configurations can be provided that can provide a self repair feature by which, for example, on power-up, a self test is performed in which weak memory rows are automatically identified by on-chip test circuitry (not shown). Through the weak row identification process, non-volatile memory elements may be programmed to provide multiple refresh to rows containing the identified weak memory elements. Thus, the dynamic memory cells can be dynamically repaired to maintain the desired low maintenance self mode or self refreshing currents. Other benefits deriving from the multiple refresh of selected memory cells or rows containing weak memory cells will be apparent to those skilled in the art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A integrated memory circuit, comprising:
   an array of memory elements that require periodic refreshing;
   an address providing circuit for providing information identifying weak memory elements in said array; and
   circuitry connected to refresh said memory elements at a rate which is varied in dependence upon said information identifying weak memory elements in said address providing circuit, said circuitry having a main refresh counter and a supplemental refresh counter, said main refresh counter being connected to said supplemental refresh counter to initiate a count of said supplemental refresh counter at predetermined counts of said main refresh counter.

2. The circuit of claim 1 wherein said address providing circuit is a programmable circuit.

3. The circuit of claim 1 wherein said address providing circuit is a programmable table.

4. The circuit of claim 1 wherein said address providing circuit is a programmable look-up table.

5. The circuit of claim 1 wherein said address providing circuit is a non-volatile programmable table.

6. The circuit of claim 1 wherein said information identifying weak memory elements is memory element address information.

7. The circuit of claim 3 wherein said circuitry to refresh comprises circuitry to refresh said weak memory elements identified in said table at a rate higher than a normal refresh rate.

8. The circuit of claim 3 wherein said circuitry to refresh comprises circuitry to refresh said weak memory elements identified in said table at a rate at least twice that of a normal refresh rate.

9. The circuit of claim 3 wherein said circuitry to refresh comprises circuitry to refresh said weak memory elements identified in said table at various rates different from that of a normal refresh rate.

10. The circuit of claim 3 wherein said circuitry to refresh comprises circuitry to refresh said weak memory elements identified in said table at various rates higher than that of a normal refresh rate.

11. A method that operates to compensate for weak memory elements within a dynamic memory circuit, comprising the steps of:
   providing an array of memory elements that require periodic refreshing;
   providing memory-element-identification-information that operates to identify weak memory elements within said array; and
   providing refresh-circuitry that is controlled by said memory-element-identification-information and is connected to refresh said weak memory elements at a rate which is varied in dependence upon said memory-element-identification-information, said refresh-circuitry having a main-refresh-counter and a supplemental-refresh-counter, said main-refresh-counter being connected to said supplemental-refresh-counter to initiate a count of said supplemental-refresh-counter at predetermined counts of said main-refresh-counter.

12. The method of claim 11 wherein said array of memory elements and said refresh-circuitry are provided on and integrated circuit chip.

13. The method of claim 12 wherein said step of providing said memory-element-identification-information includes the step of providing on said integrated circuit chip apparatus that is selected from the group programmable circuit, programmable table, programmable look-up table, and non-volatile programmable table.

14. Memory apparatus, comprising:
   an array of addressable memory elements that require periodic refreshing; said array having a refresh address input;
   a control counter having a count state output;
   a main refresh address counter having an output;
   a programmable refresh address generator having an output providing information that identifies weak memory elements within said array; and
   refresh-circuitry having an output connected to said refresh address input of said array, having a first input connected to said count state output of said control counter, having a second input connected to said output of said main refresh address counter, and having a third input connected to said output of said programmable refresh address generator;

said refresh circuitry responding to said count state output of said control counter, and operating in response thereto to selectively provide said output of said main refresh counter or said output of said programmable refresh generator to said refresh address input of said array.

15. The memory apparatus of claim 14 wherein; said refresh circuitry comprises a multiplexer, and wherein said multiplexer, said control counter, said main refresh address counter, said programmable refresh address generator, and said array of memory elements are contained on an integrated circuit chip.

16. The memory apparatus of claim 14 wherein said programmable refresh address generator is selected from the group programmable circuit, programmable table, programmable look-up table, or non-volatile programmable table.

17. The memory apparatus of claim 16 wherein; said refresh circuitry, said control counter, said main refresh address counter, said programmable refresh address generator, and said array of memory elements are contained on an integrated circuit chip.

* * * * *